US009674015B2

(12) United States Patent
Kireev et al.

(10) Patent No.: US 9,674,015 B2
(45) Date of Patent: Jun. 6, 2017

(54) CIRCUITS FOR AND METHODS OF GENERATING A MODULATED SIGNAL IN A TRANSMITTER

(71) Applicant: Xilinx, Inc., San Jose, CA (US)

(72) Inventors: Vassili Kireev, San Jose, CA (US); Yu Liao, Longmont, CO (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/798,364

(22) Filed: Jul. 13, 2015

(65) Prior Publication Data

US 2017/0019278 A1   Jan. 19, 2017

(51) Int. Cl.
| | |
|---|---|
| *H04L 25/49* | (2006.01) |
| *H03K 5/24* | (2006.01) |
| *H03K 19/094* | (2006.01) |
| *H03K 19/177* | (2006.01) |

(52) U.S. Cl.
CPC ........ *H04L 25/4919* (2013.01); *H03K 5/2481* (2013.01); *H03K 19/09425* (2013.01); *H03K 19/17788* (2013.01); *H04L 25/4917* (2013.01)

(58) Field of Classification Search
CPC .......... H04B 1/00; H04B 1/04; H04B 1/0475; H03K 3/00; H03K 17/14; H03K 17/16; H03K 19/003; H03K 19/0175; H03K 19/094; H03L 5/00; H04L 25/00; H04L 25/02; H04L 25/4919; H04L 25/49
USPC .................. 326/27, 30, 32, 81, 83, 87, 115; 327/108, 112, 333, 378; 375/257, 287
See application file for complete search history.

(56) References Cited

U.S. PATENT DOCUMENTS

| | | | |
|---|---|---|---|
| 5,428,303 A | 6/1995 | Pasqualini | |
| 6,774,666 B1* | 8/2004 | Samad | G05F 3/262 326/27 |
| 7,253,663 B2* | 8/2007 | Cho | H03K 17/302 326/115 |
| 7,474,131 B1* | 1/2009 | Hoffmann | H03K 17/163 327/108 |

(Continued)

OTHER PUBLICATIONS

Li, Mike Peng, et al., CEI-56G-MR Medium Reach Interface, Optical Internetworking Forum, Jul. 8, 2014, pp. 283-312.

(Continued)

*Primary Examiner* — Shawkat M Ali
(74) *Attorney, Agent, or Firm* — John J. King

(57) ABSTRACT

A circuit for generating a modulated signal in a transmitter of an integrated circuit is disclosed. The circuit comprises a transmitter driver circuit having a first current path for receiving a first input signal of a pair of differential input signals and a second current path for receiving a second input signal of the pair of differential input signals, the transmitter driver circuit comprising a tail current path coupled to each of the first current path and the second current path; a first current source coupled between a first reference voltage and ground, wherein a first current of the first current source is proportional to the tail current of the tail current path; a first pull-up current source coupled between the first reference voltage and a first output node of the transmitter driver circuit; and a second pull-up current source coupled between the first reference voltage and a second output node of the transmitter driver circuit. A method of generating a modulated signal in a transmitter of an integrated circuit is also disclosed.

18 Claims, 8 Drawing Sheets

(56) References Cited

U.S. PATENT DOCUMENTS

| | | |
|---|---|---|
| 7,915,915 B1 | 3/2011 | Kuzmenka et al. |
| 8,222,918 B1 * | 7/2012 | Tan ................ H03K 19/018528 326/30 |
| 8,446,173 B1 | 5/2013 | Faucher et al. |
| 2006/0215769 A1 * | 9/2006 | Haridass ............. H03F 3/45197 375/257 |
| 2008/0246511 A1 * | 10/2008 | Miura ................. H03F 3/45179 326/83 |
| 2009/0140778 A1 * | 6/2009 | Kikuchi ............. H03F 3/45197 327/108 |
| 2010/0259300 A1 | 10/2010 | Aziz et al. |
| 2014/0266320 A1 * | 9/2014 | Conrow ............... H04B 1/0475 327/108 |

OTHER PUBLICATIONS

Li, Mike Peng, et al., CEI-56G-LR Long Reach Interface, Optical Internetworking Forum, Oct. 22, 2014, pp. 1-24.

* cited by examiner

CIRCUITS FOR AND METHODS OF GENERATING A MODULATED SIGNAL IN A TRANSMITTER

FIELD OF THE INVENTION

The present invention relates generally to integrated circuit devices, and in particular, to circuits for and methods of generating a modulated signal in a transmitter.

BACKGROUND OF THE INVENTION

Data transmission speed and quality is an important aspect of data communication systems and networks. Data may be transmitted according to different data transmission protocols. Multi-level signal modulation, such as PAM4 signal modulation, is used for enhancing of data rate in bandwidth limited data communication channels. A critical transmitter parameter of a transmitter is the linearity of the output signal generated by the transmitter. That is, the deviation of each signal level in an analog transmitter output from its expected value should be small, where an expected value can be derived from positions of other levels. Output linearity can be affected by a number of factors, including the quality of the tail current source and the steering factor of input devices.

Integrated circuits enabling data transmission are an important part of the data communication systems and networks. As operating and design characteristics, such as transistor sizes and operating voltages, of integrated circuits continue to change, the performance of a transmitter circuit can be affected. Because output linearity affects the bit error rate of received data, circuit arrangements that improve output linearity are beneficial.

Accordingly, circuits and methods of providing improved output linearity of a modulated signal in a transmitter of an integrated circuit are desired.

SUMMARY OF THE INVENTION

A circuit for generating a modulated signal in a transmitter of an integrated circuit is described. The circuit comprises a transmitter driver circuit having a first current path for receiving a first input signal of a pair of differential input signals and a second current path for receiving a second input signal of the pair of differential input signals, the transmitter driver circuit comprising a tail current path coupled to each of the first current path and the second current path; a first current source coupled between a first reference voltage and ground, wherein a first current of the first current source is proportional to a tail current of the tail current path; a first pull-up current source coupled between the first reference voltage and a first output node of the transmitter driver circuit; and a second pull-up current source coupled between the first reference voltage and a second output node of the transmitter driver circuit.

According to another implementation, a circuit for generating a modulated signal in a transmitter of an integrated circuit comprises a transmitter driver circuit having a first current path for receiving a first input signal of a pair of differential input signals and a second current path for receiving a second input signal of the pair of differential input signals, the transmitter driver circuit comprising a tail current path coupled to each of the first current path and the second current path; a first current source coupled between a first reference voltage and ground, wherein the first current of the first current source is proportional to the current of the tail current path; and a current compensation circuit coupled to the first current source, wherein a second current in the current compensation circuit is proportional to a tail current in the tail current path and depends upon threshold voltages of transistors of the first current source and the current compensation circuit.

A method of generating a modulated signal in a transmitter of an integrated circuit is also described. The method comprises providing a transmitter driver circuit having a first current path for receiving a first input signal of a pair of differential input signals and a second current path for receiving a second input signal of the pair of differential input signals, the transmitter driver circuit comprising a tail current path coupled to each of the first current path and the second current path; coupling a first current source between a first reference voltage and ground, wherein a first current of the first current source is proportional to a tail current of the tail current path; coupling a first pull-up current source between the first reference voltage and a first output node of the transmitter driver circuit; and coupling a second pull-up current source between the first reference voltage and a second output node of the transmitter driver circuit.

Other features will be recognized from consideration of the Detailed Description and the Claims, which follow.

DETAILED DESCRIPTION

Data communication, and particularly multilevel data communication, requires high precision of modulation levels for each bit in a data steam, resulting in stringent requirements for linearity of the mixer stage of a driver. The circuits and methods set forth below provide high output linearity by using a high voltage pull-up current source, controlled by an analog signal proportional to the swing of the output signal. The circuits and methods also provide process/temperature parameters for open loop compensation of the transmitter driver. That is, a current compensation circuit provides additional current to compensate for the additional pull-up current sources.

While the specification includes claims defining the features of one or more implementations of the invention that are regarded as novel, it is believed that the circuits and methods will be better understood from a consideration of the description in conjunction with the drawings. While various circuits and methods are disclosed, it is to be understood that the circuits and methods are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the circuits and methods.

Figure 1:
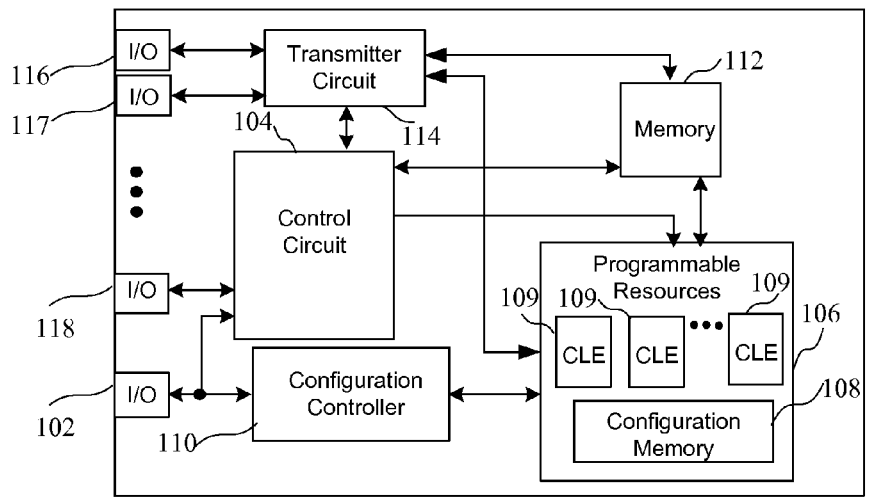
FIG. 1 is a block diagram of an integrated circuit device having a transmitter circuit for transmitting data.

Turning first to FIG. 1, a block diagram of an integrated circuit device having a transmitter circuit for transmitting data is shown. In particular, an input/output port 102 is coupled to a control circuit 104 that controls programmable resources 106 having configuration memory 108. Configuration data may be provided to the configuration memory 108 by a configuration controller 110. The configuration data enables the operation of configurable logic elements 109. While CLEs are shown by way of example as one type of programmable resources, it should be understood that other circuit elements could be implemented. A memory 112 may be coupled to the control circuit 104 and the programmable resources 106. A transmitter circuit 114 may be coupled to the control circuit 104, programmable resources 106 and the memory 112, and may transmit signals from the integrated circuit device by way of an I/O port 116. Other I/O ports may be coupled to circuits of the integrated circuit device, such as I/O port 118 that is coupled to the control circuit 104 as shown. The circuits and methods described in more detail below may be implemented by various elements of the circuit of FIG. 1, and particularly in the transmitter circuit 114.

Figure 2:
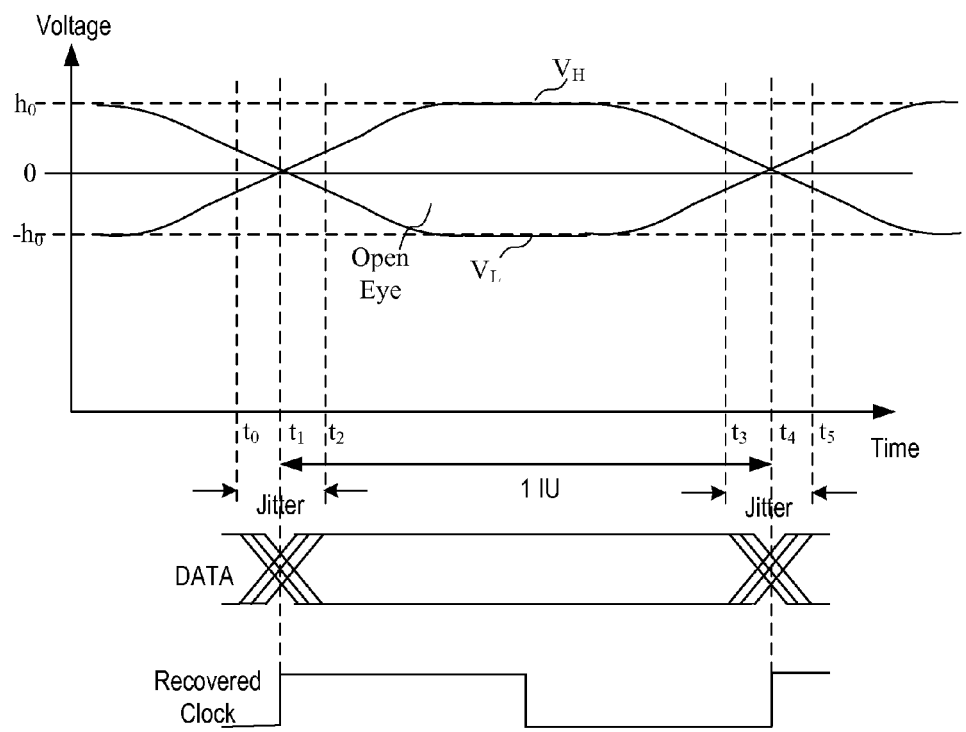
FIG. 2 is an eye diagram showing a non-return to zero (NRZ) pattern associated with data.

Before describing a circuit for transmitting data, it is helpful to describe an eye diagram associated with transmitted data. The eye diagram of FIG. 2 shows a non-return to zero (NRZ) pattern associated with data. While the example of FIG. 2 relates to a non-return-to-zero data signal (i.e. a signal varying symmetrically between a positive voltage and a negative voltage), it should be understood that the circuits and methods set forth below could relate to any type of varying input signal, such as a PAM4 signal as will be described in more detail in reference to FIGS. 5-7. A generated AC signal is typically defined by an "eye pattern," where it is desirable to have a large "open eye" portion so that a detected value at a given time in the middle of the eye pattern (i.e. between jitter on either ends of the eye pattern) can easily be detected as being associated with an expected voltage at the top or bottom of the eye pattern. The received data signal of FIG. 2 represents an NRZ input signal that is symmetrical about zero volts, where the expected value at the top of the eye pattern (i.e. a logical "1") is represented by $h_0$, and the expected value at the bottom of the eye pattern (i.e. a logical "0") is represented by $-h_0$. The beginning of the unit interval (i.e. the period between time $t_1$ and $t_4$) of the received data is at time $t_1$, where jitter may generally be detected between $t_0$ and $t_2$. The data is preferably detected at the center of the eye pattern (shown by the falling edge of the recovered clock signal approximately half way between $t_2$ and $t_3$), where jitter can be expected to be received in another jitter period between $t_3$ and $t_5$. It should be noted that the positive and negative valves are relative voltages depending upon how the nodes of the circuit are probed, where the nodes are probed differentially. While the eye pattern of FIG. 2 represents an ideal eye pattern, where the voltage level $V_H$ detected at the top of the eye pattern has a positive voltage value of $h_0$, and the voltage level $V_L$ detected at the bottom of the eye pattern has a negative voltage value of $-h_0$, it should be noted that the typical eye pattern for received data over time varies. Therefore, the sharp line representing the eye pattern would be shown by a much wider pattern representing variations in the detected values over time.

Figure 3:
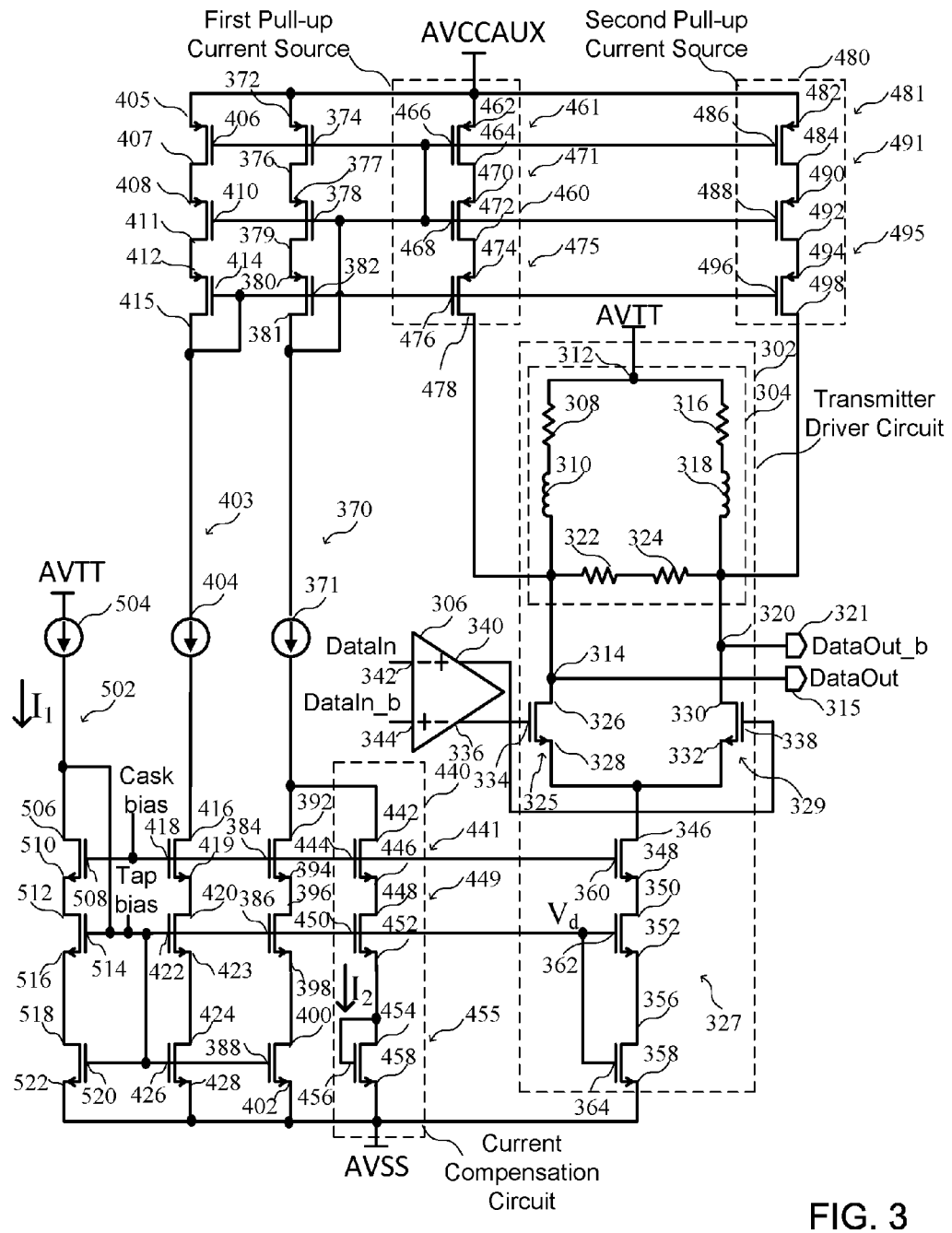
FIG. 3 is a block diagram of a circuit for generating a modulated signal in a transmitter of an integrated circuit.

Turning now to FIG. 3, a block diagram of a circuit for generating a modulated signal in a transmitter of an integrated circuit is shown. In particular, a transmitter driver circuit 302, shown here as a current mode logic (CML) circuit, comprises an output portion 304 and is coupled to a pre-driver circuit 306 comprising an amplifier. The output portion 304 comprises a resistor 308 and an inductor 310 coupled in series between a node 312 coupled to a first reference voltage source (AVTT) and a first output node 314 that is coupled to an output terminal 315. The output portion also comprises a second resistor 316 and a second inductor 318 coupled in series between the node 312 and a second output node 320 that is coupled to an output terminal 321. Resistors 322 and 324 are coupled in series across the output nodes 314 and 320 as claimed. The pre-driver circuit 306 is coupled to output transistors of the transmitter driver circuit 302 including a transistor 325 having a drain 326 coupled to the output node 314 and a source 328 coupled to a tail current path 327, and a transistor 329 having a drain 330 coupled to the node 320 and a source 332 coupled to the tail current path 327. A gate 334 of the transistor 325 is coupled to a first output 336 of the pre-driver circuit 306, and a gate 338 of the transistor 329 is coupled to a second output 340 of the pre-driver stage 306, where differential input data (digital input values DataIn and DataIn_b) received at inputs 342 and 344 is amplified by the pre-driver circuit 306 and generated as an analog output signal at the output terminals 315 and 321 of the transmitter driver circuit 302. The tail current path 327 comprises a plurality of N-channel transistors coupled in series including a first transistor having a drain 346 coupled to the sources of the transistors 325 and 329, and a source 348 coupled to a drain 350 of a second transistor having a source 352 coupled to a drain 356. A source 358 of the third transistor is coupled to a ground reference voltage (AVSS). A gate 360 of the first transistor is coupled to receive a cascode bias signal (Casc bias), while gates 362 and 364 of the second and third transistors are coupled to receive a Tap bias. The function of the Casc bias and the Tap bias will be described in more detail below.

A first current source 370 comprises a current driver 371 coupled to a plurality of P-channel transistors having a first transistor comprising a source 372 coupled to a second reference voltage (AVCCAUX). As will be described in more detail below, the second reference voltage AVCCAUX is greater than the first reference voltage AVTT. A drain 376 of the first transistor is coupled to a source 377 of a second transistor. A drain 379 of the second transistor is coupled to a source 380 of a third transistor having a drain 381 coupled to the current driver 371. A gate 378 and a gate 382 of the first and second transistors are coupled together and to the drain 381 of the third transistor.

The Casc bias signal is also coupled to a gate 384, and the Tap bias signal is coupled to gates 386 and 388 of a series of N-channel transistors coupled between the current driver 371 and the ground reference voltage AVSS. In particular, a drain 392 of the first transistor of the series is coupled to the current driver 371 and a source 394 is coupled to a drain 396 of a second transistor. A source 398 of the second transistor is coupled to a drain 400 of a third transistor having a source 402 coupled to the ground reference voltage AVSS.

A second current source 403 is also provided between the reference voltage AVCCAUX and the ground reference voltage AVSS. In particular, the second current source comprises a second current driver 404 coupled to a series of P-channel transistors including a first transistor having a source 405 coupled to the reference voltage AVCCAUX and a gate 406 coupled to the gate 374. A drain 407 is coupled to a source 408 of a second transistor having a gate 410 coupled to the gate 378. The drain 411 of the second transistor of the series is coupled to a source 412 of a third transistor having a gate 414 coupled to the gate 382 and to a drain 415 coupled to the second current driver 404.

The second current driver 404 is also coupled to a series of N-channel transistors controlled by the Casc bias and Tap bias signals. In particular, a drain 416 of a first transistor of the series is coupled the second current driver 404, while the gate 418 is coupled to the Casc bias signal. A source 419 of the first transistor is coupled to a drain 420 of a second transistor. A gate 422 of the second transistor is coupled to receive the Tap bias signal. A source 423 of the second transistor is coupled to a drain 424 of a third transistor that also has a gate 426 coupled to receive the Tap bias signal. A source 428 of the third transistor is coupled to the ground reference voltage AVSS.

A current compensation circuit 440 is coupled to the first current source 370 in parallel with the series of N-channel transistors coupled to the first current source 370 as shown. In particular, the compensation circuit 440 comprises a plurality of N-channel transistors coupled in series, including a first transistor 441 having a gate 442 coupled to the drain 392 of the first transistor of the series of N-channel transistors of the first current source 370. A gate 444 of the transistor 441 is coupled to receive the Casc bias signal, which is used to enable current in the current path. A source 446 of the transistor 441 is coupled to a drain 448 of a transistor 449 having a gate 450 coupled to receive the Tap bias signal. A source 452 of the transistor 449 is coupled to a drain 454 of a transistor 455 having a gate 456 coupled to the drain 454 and having a source 458 coupled to the ground reference AVSS.

As will be described in more detail below, the current in the current compensation circuit 440 is proportional to the current in the N-channel transistors coupled between the current driver 371 and ground, where the current in the N-channel transistors coupled between the current driver 371 and ground are independent of PVT variations, while the current in the current compensation circuit 440 is dependent upon PVT variations. The tail current in the tail current path 327 is also proportional to the current in the N-channel transistors coupled between the current driver 371 and ground. The current compensation circuit 440 provides additional current to compensate for additional pull-up current sources in the circuit of FIG. 3, as will be described in more detail below.

In particular, a first pull-up current source 460 is coupled between the second reference voltage source AVCCAUX and the output node 314 of the transmitter driver circuit 302. The second reference voltage source AVCCAUX is preferably greater that the first reference voltage source AVTT. By way of example, the first reference voltage source AVTT could be between approximately 1 volt and 1.2 volts, and the second reference voltage source AVCCAUX could be between approximately 1.5 volts and 1.8 volts. The first pull-up current source 460 comprises a plurality of P-channel transistors coupled in series, including a first transistor 461 having a source 462 coupled to the second reference voltage AVCCAUX and a gate 466 coupled to the drain 381 at the current driver 371. A drain 464 of the transistor 461 is coupled to a source 470 of a second transistor 471. A gate 468 of the transistor 471 is also coupled to the drain 381 at the current driver 371. A drain 472 of the second transistor is coupled to a source 474 of a third transistor 475. A gate 476 is coupled to the gates 382 and 414 and the drain 415 at the current driver 404. A drain 478 of the third transistor 475 is coupled to the output node 314.

The second pull-up current source 480 also comprises a plurality of P-channel transistors coupled in series, including a first transistor 481 having a source 482 coupled to the second reference voltage AVCCAUX and a gate 486 coupled to the drain 381 at the current driver 371. A drain 484 of the transistor 481 is coupled to a source 490 of a second transistor 491. A gate 488 of the transistor 491 is also coupled to the drain 381 at the current driver 371. A drain 492 of the second transistor is coupled to a source 494 of a third transistor 495. A gate 496 is coupled to the gates 382 and 414 and the drain at the current driver 404. A drain 498 is coupled to the node 320.

The first and second pull-up current sources 460 and 480 and the current compensation circuit 440 provide improved performance for the driver. The first and second pull-up current sources 460 and 480 enable providing greater swing of the differential output signal Data Out and Data Out_b. Because the current of the pull-up current sources 460 and 480 is proportional to the current of the tail current path of the driver circuit, and therefore may be dependent on process, voltage and temperature (PVT) variations, the current compensation circuit 440 is included to provide additional compensation current when the overdrive voltage of the tail current path is high or the threshold voltage of the driver input device is low, as will be described in more detail below.

A current source 502 is also provided, and comprises a current driver 504 coupled to a series of N-channel transistors comprising first transistor having a drain 506 coupled to the current driver 504, and a gate 508 coupled also coupled to the Casc bias signal. A source 510 is coupled to a drain 512 of a second transistor having a source 516 coupled to a drain 518 of a third transistor. The source 522 of the third transistor is coupled to the ground voltage AVSS. The gate 514 and 520 of the second and third transistors are coupled to receive the Tap bias signal. The current in the N-channel transistors coupled between the current driver 371 and ground is proportional to the current $I_1$, but is independent of PVT variations, while the current in the current compensation circuit 440 is also proportional to the current $I_1$ and is therefore proportional to the current in the N-channel transistor coupled between the current driver 371 and ground, but is dependent upon PVT variations, as will be described in more detail below. The tail current in the tail current path 327 is also proportional to the current in the N-channel transistors coupled between the current driver 371 and ground as well as the current $I_1$.

For normal operation of CML type of driver having a 1.2V reference voltage, headroom of a current source can be approximately 150 mV. This results in low output resistance of the tail current path, and therefore a linear output. A tail voltage (i.e. the voltage at the drain 346 of the first transistor of the tail current path 327) for higher swing states is lower than for low swing states. This would apply to swing states which are large for NRZ data having one differential output level, or for the larger outputs (i.e. −3, 3 differential output values) of PAM4 data. This is because drain voltages of driver input devices (i.e. the voltages at drains 326 and 330 of transistors 325 and 329, respectively) are higher for lower swing states (e.g. swing states 1, −1). The higher drain voltages results in tail current modulation due to a low resistance Rout of tail current path. If steering is not 100%, tail voltage modulation results in different leakage for high and low swings. Therefore, high linearity could be achieved by improving of tail current quality and improving of steering factor of input devices.

Figure 5:
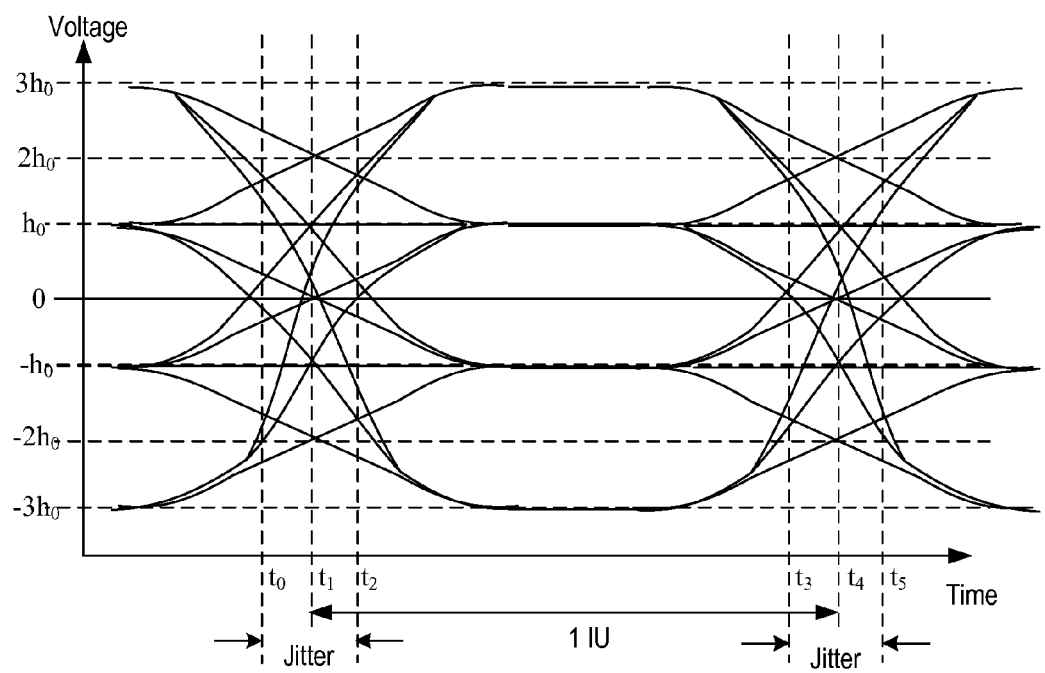
FIG. 5 is an eye diagram showing a PAM4 pattern associated with data.

With a supply voltage 1.2V for a typical CML driver having a 1V swing, the estimated Ratio of Transmitter Level Mismatch ($R_{LM}$) is approximately 0.95, but can be 0.92 and below over pressure, voltage and temperature (PVT) variations. The $R_{LM}$ value associated with a transmitter is defined according to the following equations;

$$S_{min} = \text{Min}(V_D - V_C, V_C - V_B, V_B - V_A)/2 \quad (1)$$

$$V_{avg} = (V_A + V_B + V_C + V_D)/4 \quad (2)$$

$$R_{LM} = (6 * S_{min})/(V_A - V_D), \quad (3)$$

where $V_D = 3h_0$, $V_C = h_0$, $V_B = -h_0$ and $V_A = -3h_0$, as will be described in more detail in reference to FIG. 5. While a minimum $R_{LM}$ value allowed by many standards is 0.92, a higher linearity value provides greater output linearity, and is therefore more desirable. It has been determined that a bit error rate (BER) for received data degrades linearly (in a semi-log scale) one decade per $R_{LM}$ change of 0.4-0.5. Therefore, it may be desirable to set a minimum $R_{LM} = 0.96$ to achieve a high performance link. In order to improve tail current source headroom, the pull-up current sources 460 and 480 are used as shown in FIG. 3. The pull-up current sources are tied to a higher voltage than the 1.2V source tied to the transmitter driver circuit 302 in order to achieve high swing of the output signal of the current driver. That is, because of the higher voltage of AVCCAUX, the output nodes 314 and 320 are pulled to a higher voltage by the pull-up current sources 460 and 480, therefore enabling a greater swing of the output signal at the output terminals 315 and 321. Because the linearity of the driver is strongly dependent on PVT variations, additional compensation current which is dependent on a PVT is provided by the current compensation circuit 440.

More particularly, the current compensation circuit 440 provides more current when tail overdrive voltage is high and/or threshold voltage of the driver input device is lower. The current mirror provided by the current compensation circuit 440 can be designed based on the following transistor equations:

$$I1 = \frac{W\mu C}{2\sqrt{2}\,L}[Vd - Vth1]^2 \quad (4)$$

$$I2 = \frac{W\mu C}{2\sqrt{2}\,L}[[Vd - Vth1] - Vth2]^2 \quad (5)$$

where W is equal to the transistor gate width, µ is equal to mobility, C is equal to gate oxide capacitance, L is equal to transistor gate length, $V_{th1}$ is equal to the threshold voltages of the the transistors of the current source 502, $Vt_{h2}$ threshold voltages of the transistors of the current compensation circuit 440. As can be seen from equation (5), the current $I_2$ tracks tail overdrive and input threshold at the same time and provide an additional current needed for compensation. The current compensation circuit 440 provides additional current when the overdrive voltage is high, where the overdrive voltage is the difference between the gate-to-source voltage and the threshold voltage of the transistors of the current source 502. $I_1$ is proportional to the tail current, but is independent of PVT variations. $I_2$ is also proportional to the tail current, but with coefficients depending upon PVT variations. As shown in Equation (5), the high overdrive of the tail current path and/or the low $V_{th}$ of transistors of the first current source 502 results in higher current.

Figure 4:
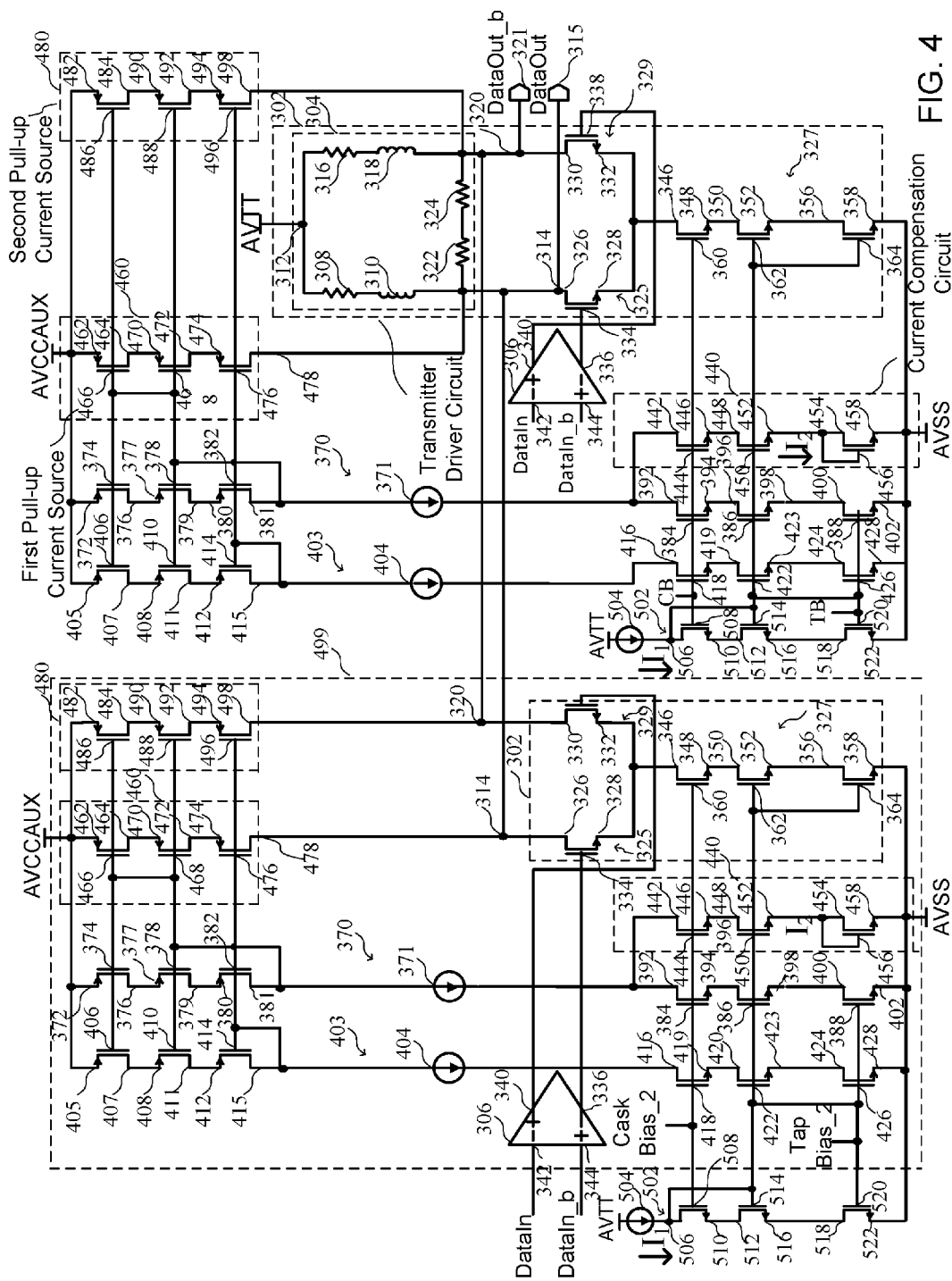
FIG. 4 is a block diagram of a circuit having a plurality of stages for generating a modulated signal in a transmitter of an integrated circuit.

The transmitter circuit can also have a plurality of driver stages coupled to the output terminals, where the bias currents of the stages can be separately controlled based upon coefficients of a filter, such as a Finite impulse response (FIR) filter, for example. As shown in FIG. 4, a block diagram of a circuit having a plurality of stages enables generating a modulated signal in a transmitter of an integrated circuit. In addition to the elements of FIG. 3, a second stage 499 (including all of the elements of FIG. 3 except for the output portion 304) is coupled to nodes at the output terminals, where the drains 326 and 330 of the output transistors 325 and 329 of the second stage 499 are also coupled to the output terminals 315 and 321. The bias inputs for the N-channel transistors of the second stage 499 are coupled to receive second bias signals, shown here as Cask Bias_2 and Tap Bias_2. The second bias currents could be based upon different taps of a FIR filter, for example. Although two stages are shown, it should be understood that other stages could also be included. By way of example, 3 stages could be included, where a pre-cursor stage and a post-cursor stage could be included in addition to the main stage of FIG. 3. Because the first order current of a pull-up current source is proportional to the total driver current, current from each tap should be mirrored to supply each tap pull-up current source individually.

The circuits and methods find particular applications with multi-level outputs such as the multi-levels of a PAM4 data transmission. A PAM4 pattern associated with data is shown in FIG. 5. While the circuit of FIGS. 3 and 4 apply to NRZ signaling, it should be understood that the circuit of FIGS. 3 and 4 could be adapted for PAM4 signaling schemes. The diagram of FIG. 5 shows received data signals according to a PAM4 protocol, where the received voltage of the signal may have a value of $-3h_0$, $-h_0$, $h_0$ or $3h_0$. According to the PAM4 protocol, a single value can be used to generate two bits of data, where $-3h_0$ may be represent 00, $-h_0$ may represent 01, $h_0$ may represent 10, and $3h_0$ may represent 11.

In order to determine the appropriate value of a reference voltage to provide for a comparison with a detected value when implementing the PAM4 protocol, a level detection circuit determines in which of 4 possible ranges the detected voltage falls, and compares the detected value to a predetermined value associated with one of the 4 possible ranges. In particular, if a detected value of the input signal is determined to be greater than $+2h_0$, then the $+3h_0$ voltage value will be used as the reference value input to an error detector. If a detected value of the input signal is determined to be between 0 and $+2h_0$, then the $+h_0$ voltage value will be used as the reference value input to the error detector. If a detected value of the input signal is determined to be between 0 and $-2h_0$, then the $-h_0$ voltage value will be used as the reference value input to the error detector. Finally, if a detected value of the input signal is determined to be less than $-2h_0$, then the $-3h_0$ voltage value will be used as the reference value input to the error detector.

Figure 6:
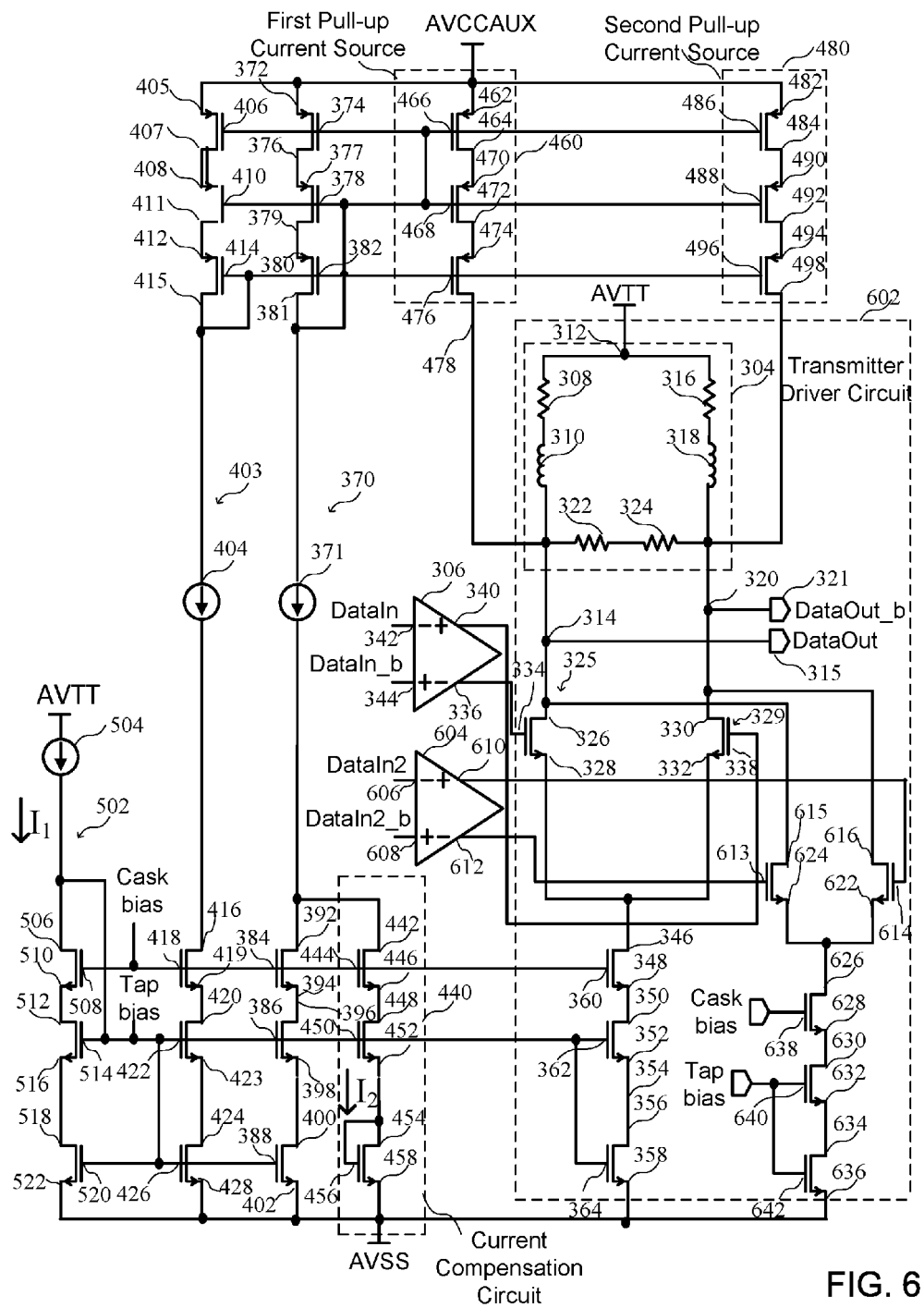
FIG. 6 is a block diagram of a circuit for generating a PAM4 signal in a transmitter of an integrated circuit.

Turning now to FIG. 6, a block diagram of a circuit for generating a PAM4 signal in a transmitter of an integrated circuit is shown. In particular, in addition to the elements of the circuit of FIG. 3, a driver circuit 602 is coupled to a second pre-driver 604 that receives second inputs DataIn2 and DataIn2_b_2 at inputs 606 and 608, respectively. The outputs 610 and 612 are coupled to gates 613 and 614, respectively, of first and second transistors having drains 615 and 616 coupled to output nodes 314 and 320. The sources 622 and 624 of the first and second transistors are coupled to a drain 626 of a first transistor of a series of N-channel transistors of a second tail current path also coupled to receive the Cask bias and Tap bias signal. In particular, a source 628 of the first transistor is coupled to a drain 630 of the second transistor. A source 632 of the second transistor is coupled to a drain 634 of a third transistor having a source coupled to the ground node AVSS. The Casc bias signal is coupled to a gate 638 of the first transistor of the series of transistors, while the Tap bias signal is coupled to the gates 640 and 642 of the second and third transistors. According to the implementation of the circuit of FIG. 6, the output data (DataOut and DataOut_b) is based upon the input data coupled to both the pre-driver circuit 306 and the pre-driver circuit 604. That is, the differential output voltages representing the output data are based upon a combination of both inputs DataIn and DataIn2, which could have a combination of 00, 01, 10, or 11 as described above in reference to the PAM4 signaling.

Figure 7:
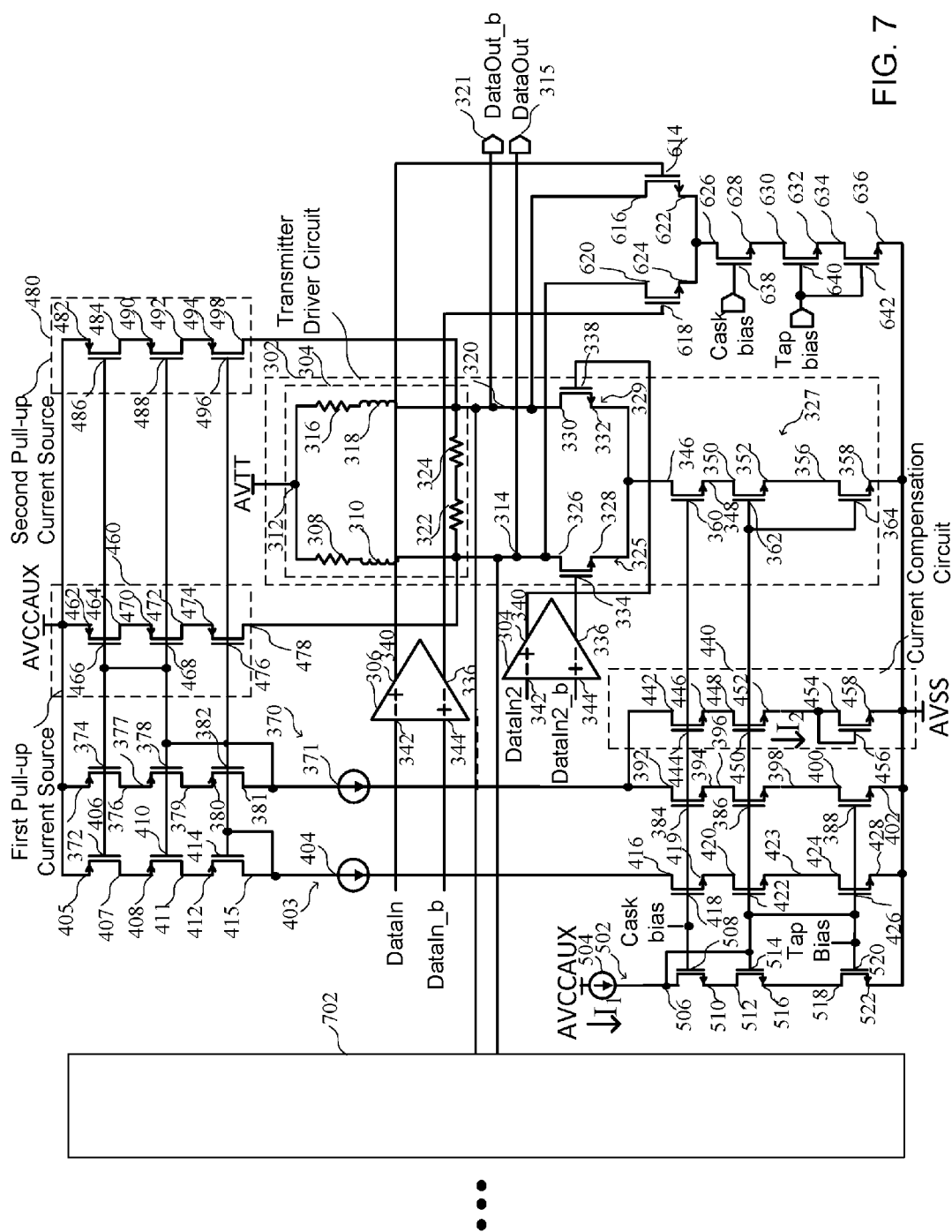
FIG. 7 is a block diagram of a circuit having a plurality of stages for generating a PAM4 signal in a transmitter of an integrated circuit.

Turning now to FIG. 7, a block diagram of a circuit having a plurality of stages for generating a PAM4 signal in a transmitter of an integrated circuit is shown. In particular, one or more additional stages can be added to the transmitter of FIG. 6, as described above in reference to FIG. 4. That is, each stage 702 comprises all of the elements of FIG. 6 except the output portion 304, where each stage receives the data inputs (DataIn, DataIn_b, DataIn_2, DataIn_2), but would be controlled by different Casc bias and Tap bias signals. For example, 3 stages could be implemented, where a pre-cursor stage and a post-cursor stage could be implemented in addition to the main stage of FIG. 6.

Figure 8:
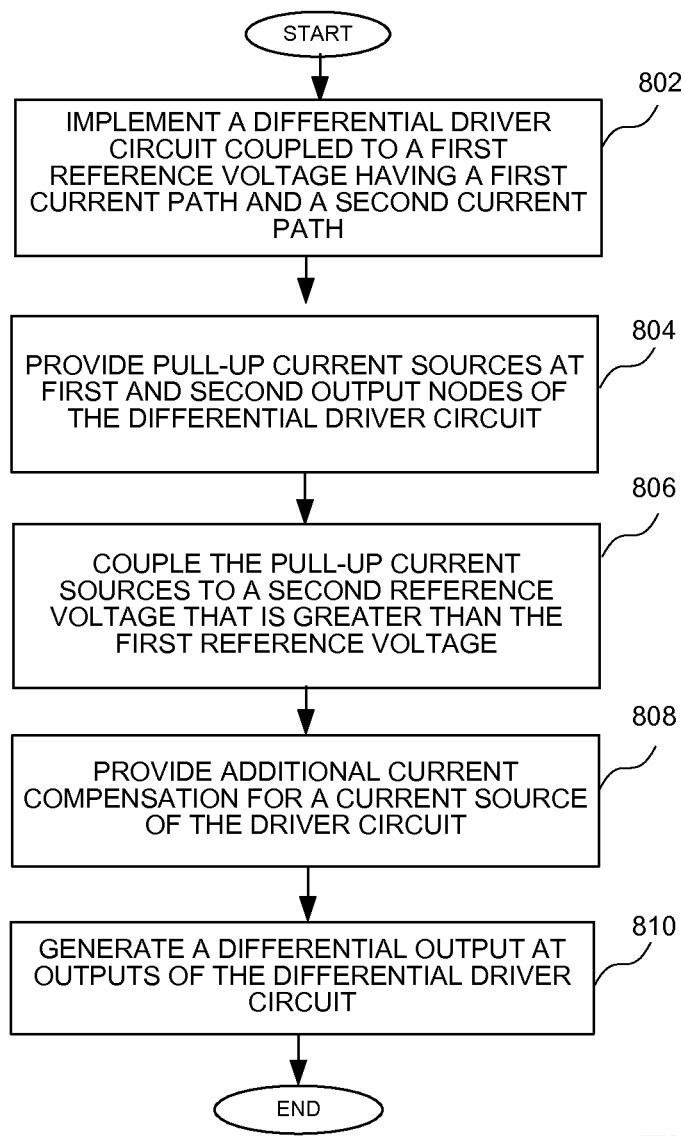
FIG. 8 is a flow chart showing a method of generating a modulated signal in a transmitter of an integrated circuit.

Turning now to FIG. 8, a flow chart shows a method of generating a modulated signal in a transmitter of an integrated circuit. In particular, a differential driver circuit such as transmitter driver circuit 302 coupled to a first reference voltage having a first current path and a second current path is implemented at a block 802. Pull-up current sources are provided at first and second output nodes of the differential driver circuit at a block 804. The pull-up current sources are coupled to a second reference voltage that is greater than the first reference voltage at a block 806. The pull-up circuit may be pull-up circuits 460 and 480 as described in FIG. 3, for example. Additional current compensation is also provided for a current source of the driver circuit at a block 808. The additional compensation current may be provided by the current compensation circuit 440 of FIG. 3, for example. A differential output is generated at outputs of the differential driver circuit at a block 810.

Figure 9:
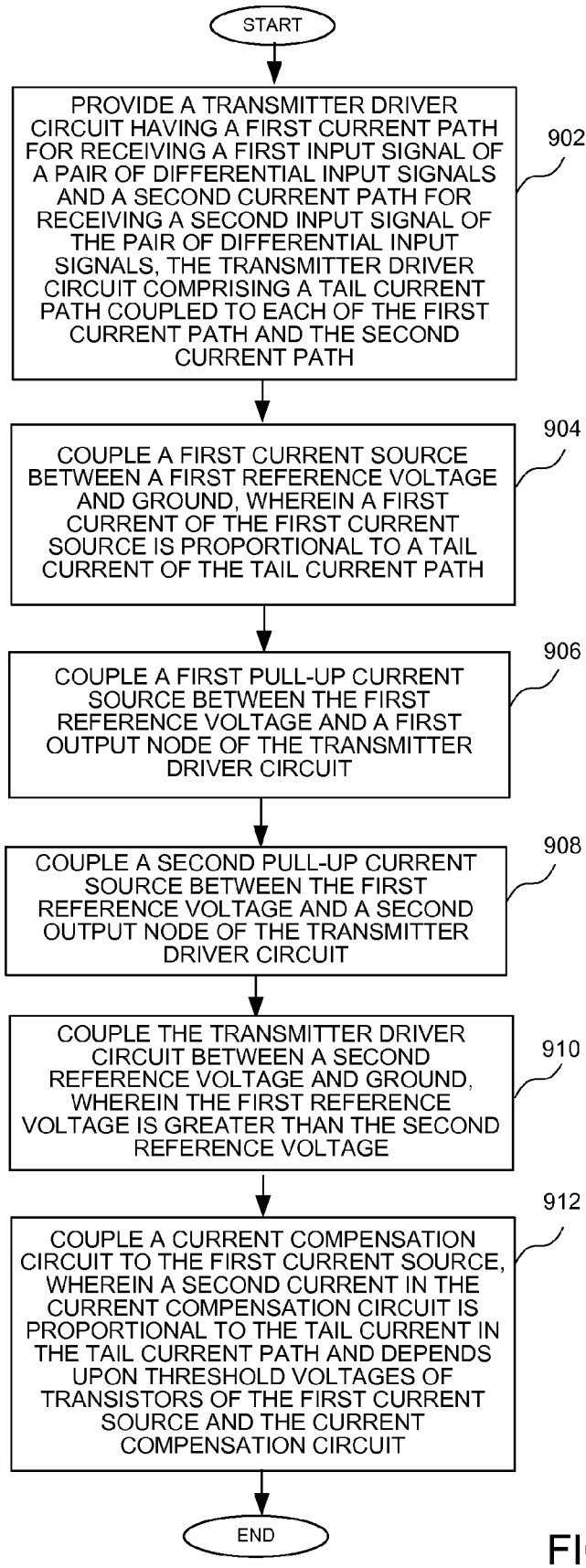
FIG. 9 is a flow chart showing another method of generating a modulated signal in a transmitter of an integrated circuit.

Turning now to FIG. 9 is a flow chart shows another method of generating a modulated signal in a transmitter of an integrated circuit. A transmitter driver circuit having a first current path for receiving a first input signal of a pair of differential input signals and a second current path for receiving a second input signal of the pair of differential input signals is provided at a block at a block 902. The transmitter driver circuit comprises a tail current path, such as tail current path 327, and is coupled to each of the first current path and the second current path. A first pull-up current source is coupled between a first reference voltage and ground at a block 904, wherein a first current of the first current source is proportional to a tail current of the tail current path. The first current source could be current source 370, for example. A first pull-up current source is coupled between the first reference voltage and a first output node of the transmitter driver circuit at a block 906. A second pull-up current source is coupled between the first reference voltage and a second output node of the transmitter driver circuit at a block 908. The first and second pull-up current sources could be the pull-up current sources 460 and 480, for example.

The transmitter driver circuit is coupled between a second reference voltage and ground at a block 910, wherein the first reference voltage is greater than the second reference voltage. The transmitter driver circuit could be the transmitter driver circuit 302 for example. A current compensation circuit, such as the current compensation circuit 440, is coupled to the first current source at a block 912, wherein a second current in the current compensation circuit is proportional to the tail current in the tail current path and depends upon threshold voltages of transistors of the first current source and the current compensation circuit.

The various elements of the methods of FIGS. 8 and 9 may be implemented using the circuits of FIGS. 1-7 as described, or using some other suitable circuits. While specific elements of the method are described, it should be understood that additional elements of the method, or additional details related to the elements, could be implemented according to the disclosure of FIGS. 1-7.

It can therefore be appreciated that new circuits for and methods of generating a modulated signal in a transmitter of an integrated circuit has been described. It will be appreciated by those skilled in the art that numerous alternatives and equivalents will be seen to exist that incorporate the disclosed invention. As a result, the invention is not to be limited by the foregoing embodiments, but only by the following claims.

We claim:

1. A circuit for generating a modulated signal in a transmitter of an integrated circuit, the circuit comprising:
    a transmitter driver circuit having a first current path for receiving a first input signal of a pair of differential input signals and a second current path for receiving a second input signal of the pair of differential input signals, the transmitter driver circuit comprising a tail current path coupled to each of the first current path and the second current path;
    a first current source coupled between a first reference voltage and a ground, wherein a first current of the first current source is proportional to a tail current of the tail current path;
    a first pull-up current source coupled between the first reference voltage and a first output node of the transmitter driver circuit; and
    a second pull-up current source coupled between the first reference voltage and a second output node of the transmitter driver circuit;
    wherein the transmitter driver circuit is coupled between a second reference voltage and the ground, wherein the first reference voltage is greater than the second reference voltage.

2. The circuit of claim 1 further comprising a current compensation circuit coupled to the first current source, wherein a second current in the current compensation circuit is proportional to the tail current in the tail current path and depends upon threshold voltages of transistors of the first current source and the current compensation circuit.

3. The circuit of claim 1 wherein the first current source is coupled to receive a first bias signal to control the first current in the first current source.

4. The circuit of claim 1 further comprising a second current source coupled between the first reference voltage and the ground, wherein a second current of the second current source is proportional to the tail current of the tail current path.

5. The circuit of claim 4 further comprising a third pull-up current source coupled between the first reference voltage and the first output node of the transmitter driver circuit, and a fourth pull-up current source coupled between the first reference voltage and the second output node of the transmitter driver circuit.

6. The circuit of claim 5 further comprising a current compensation circuit coupled to the second current source, wherein a third current in the current compensation circuit is proportional to the tail current in the tail current path and depends upon threshold voltages of transistors of the third pull-up current source and the current compensation circuit.

7. A circuit for generating a modulated signal in a transmitter of an integrated circuit, the circuit comprising:
    a transmitter driver circuit having a first current path for receiving a first input signal of a pair of differential input signals and a second current path for receiving a second input signal of the pair of differential input signals, the transmitter driver circuit comprising a tail current path coupled to each of the first current path and the second current path;
    a first current source coupled between a first reference voltage and a ground and having a current driver, wherein a first current of the first current source is proportional to the current of the tail current path; and
    a current compensation circuit coupled between the current driver of the first current source and the ground, wherein a second current in the current compensation circuit is proportional to a tail current in the tail current path and depends upon threshold voltages of transistors of the first current source and the current compensation circuit.

8. The circuit of claim 7 wherein the transmitter driver circuit is coupled between a second reference voltage and the ground, wherein the first reference voltage is greater than the second reference voltage.

9. The circuit of claim 7 further comprising a first pull-up current source coupled between the first reference voltage and a first output node of the transmitter driver circuit and a second pull-up current source coupled between the first reference voltage and a second output node of the transmitter driver circuit.

10. The circuit of claim 7 wherein the first current source is coupled to receive a first bias signal to control the first current in the first current source.

11. The circuit of claim 7 further comprising a second current source coupled between the first reference voltage and the ground, wherein a second current of the second current source is proportional to the tail current of the tail current path.

12. The circuit of claim 11 further comprising a third pull-up current source coupled between the first reference voltage and a first output node of the transmitter driver circuit, and a fourth pull-up current source coupled between the first reference voltage and a second output node of the transmitter driver circuit.

13. The circuit of claim 12 further comprising a second current compensation circuit coupled to the second current source, wherein a third current in the second current compensation circuit is proportional to the tail current in the tail current path and depends upon threshold voltages of transistors of the second current source and the second current compensation circuit.

14. A method of generating a modulated signal in a transmitter of an integrated circuit, the method comprising:
    providing a transmitter driver circuit having a first current path for receiving a first input signal of a pair of differential input signals and a second current path for receiving a second input signal of the pair of differential input signals, the transmitter driver circuit comprising a tail current path coupled to each of the first current path and the second current path;
    coupling a first current source between a first reference voltage and a ground, wherein a first current of the first current source is proportional to a tail current of the tail current path;
    coupling a first pull-up current source between the first reference voltage and a first output node of the transmitter driver circuit;
    coupling a second pull-up current source between the first reference voltage and a second output node of the transmitter driver circuit; and
    coupling the transmitter driver circuit between a second reference voltage and the ground, wherein the first reference voltage is greater than the second reference voltage.

15. The method of claim 14 further comprising coupling a current compensation circuit to the first current source, wherein a second current in the current compensation circuit is proportional to the tail current in the tail current path and depends upon threshold voltages of transistors of the first current source and the current compensation circuit.

16. The method of claim 14 further comprising coupling a second current source between a first reference voltage and the ground, wherein a second current of the second current source is proportional to the tail current of the tail current path.

17. The method of claim 16 further comprising coupling a third pull-up current source between the first reference voltage and the first output node of the transmitter driver circuit, and coupling a fourth pull-up current source between the first reference voltage and the second output node of the transmitter driver circuit.

18. The method of claim 17 further comprising coupling a second current compensation circuit to the second current source, wherein a third current in the second current compensation circuit is proportional to the tail current in the tail current path and depends upon threshold voltages of transistors of the second current source and the second current compensation circuit.

* * * * *